United States Patent [19]

Dougherty, Jr. et al.

[11] Patent Number: 4,598,470
[45] Date of Patent: Jul. 8, 1986

[54] METHOD FOR PROVIDING IMPROVED ELECTRICAL AND MECHANICAL CONNECTION BETWEEN I/O PIN AND TRANSVERSE VIA SUBSTRATE

[75] Inventors: William E. Dougherty, Jr., Poughkeepsie, N.Y.; Stuart E. Greer, Shelburne, Vt.; Robert W. Sargent, LaGrangeville, N.Y.

[73] Assignee: International Business Machines Corporation, Armonk, N.Y.

[21] Appl. No.: 713,569

[22] Filed: Mar. 18, 1985

Related U.S. Application Data

[63] Continuation-in-part of Ser. No. 506,071, Jun. 20, 1983, abandoned.

[51] Int. Cl.⁴ .............................................. H05K 3/30
[52] U.S. Cl. ...................................... 29/837; 29/832; 174/68.5; 264/61
[58] Field of Search ................. 29/896, 825, 830, 837, 29/852; 174/68.5

[56] References Cited

U.S. PATENT DOCUMENTS

| | | | |
|---|---|---|---|
| 3,518,756 | 7/1970 | Bennett et al. ........................ | 29/846 |
| 3,555,673 | 1/1971 | Summerlin ............................ | 29/629 |
| 3,880,971 | 4/1975 | Pantanelli ......................... | 264/61 X |
| 3,988,408 | 10/1976 | Haining et al. .................. | 264/235 X |
| 4,133,101 | 1/1979 | Glover ................................... | 29/628 |
| 4,153,491 | 5/1979 | Swiss et al. ....................... | 264/61 X |
| 4,193,082 | 3/1980 | Dougherty .......................... | 357/80 |
| 4,202,007 | 5/1980 | Dougherty et al. ................. | 357/80 |
| 4,216,576 | 10/1980 | Ammon ............................... | 29/845 |
| 4,237,606 | 12/1980 | Niwa et al. .......................... | 29/830 |
| 4,247,981 | 2/1981 | Walters ................................ | 29/845 |
| 4,289,719 | 9/1981 | McIntosh et al. .................... | 264/61 |
| 4,336,088 | 6/1982 | Hetherington et al. ....... | 174/68.5 X |
| 4,349,862 | 9/1982 | Bajorek et al. ................ | 174/68.5 X |
| 4,407,007 | 9/1983 | Desai et al. .................... | 174/68.5 X |
| 4,434,134 | 2/1984 | Darrow et al. .................... | 29/852 X |
| 4,443,278 | 4/1984 | Zingher ........................ | 174/68.5 X |
| 4,524,038 | 6/1985 | Heinemann et al. ................. | 264/61 |
| 4,524,239 | 6/1985 | Rouge ................................ | 174/68.5 |

FOREIGN PATENT DOCUMENTS 1021320 3/1966 United Kingdom .

OTHER PUBLICATIONS

IBM Tech. Discl. Bull., vol. 8, No. 11, Apr. 1966, p. 1471 (by J. Antenveci).
IBM Tech. Discl. Bull., vol. 13, No. 6, Nov. 1970, p. 1626 (by G. Thomas).
IBM Tech. Discl. Bull., vol. 15, No. 2, Jul. 1972, pp. 624–625 (by C. Pettie).

*Primary Examiner*—Howard N. Goldberg
*Assistant Examiner*—Carl J. Arbes
*Attorney, Agent, or Firm*—Mark F. Chadurjian; George Tacticus; William N. Hogg

[57] ABSTRACT

A method of making an aperture of a predetermined shape into a dielectric substrate which will lockingly receive a deformable contact pin. It includes providing a dielectric material which shrinks in response to a heat treatment by an amount which is different in one direction from that in another direction, and which irreversibly changes dimensions in its two orthogonal directions in proportion to this difference. An aperture is formed in such a material, in a direction normal to the plane of the two orthogonal directions and the material is subjected to a heat treatment that causes a differential shrinkage in the aperture and a change in the shape of the aperture. A deformable contact pin is then forced into a locking position in the aperture. By using such a method to lock a contact pin in close proximity to a conductive line extending across the substrate or by having the aperture and the pin extend through the substrate, electrical circuits on one side of the substrate can be contacted through a contact pin on the opposite side of the substrate.

10 Claims, 11 Drawing Figures

METHOD FOR PROVIDING IMPROVED ELECTRICAL AND MECHANICAL CONNECTION BETWEEN I/O PIN AND TRANSVERSE VIA SUBSTRATE

CROSS-REFERENCE TO RELATED APPLICATIONS

This is a continuation-in-part of co-pending application Ser. No. 506,071, filed on June 20, 1983 now abandoned.

DESCRIPTION

1. Technical Field

This invention relates in general to methods for making semiconductor packages and more particularly to methods for providing multilayer dielectric substrates having embedded electrical conductors and contact pins electrically connected with such conductors and mechanically secured in apertures.

2. Background

In an effort to increase the density of circuits that can be placed on supporting substrates, multilayer dielectric substrates have been provided having embedded conductors that reach from one side of the substrate to the other. U.S. Pat. No. 4,193,082 entitled "Multi-Layer Dielectric Structure", issued on Mar. 11, 1980, to William E. Dougherty and U.S. Pat. No. 4,202,007 entitled "Multilayer-Layer Dielectric Planar Structure Having an Internal Conductor Pattern Characterized With Opposite Terminations Disposed At A Common Edge Surface Of The Layers", issued on May 6, 1980, to William E. Dougherty and Stuart E. Greer and both assigned to the present assignee, disclose multilayer dielectric substrates formed of a plurality of dielectric plannar layers having a plurality of conductive leads coextensive with the planes of the layers and each having terminations at the edge surfaces of the layers. On these terminations there are input/output (I/O) metallization contact pins, or jacks, solder pads or other conductive materials. One proposed use for such a structure is to support integrated circuits disposed on one of the two major surfaces of the structure which are parallel to the planes of the layers, making electrical contact with the appropriate conductive leads and on the opposite surface to place I/O contact pins for connecting the conductive leads with external sources. In order to electrically connect the circuit from one surface of the structure to the opposite surface, these patents disclose the use of appropriate conductive via lines. Alternatively, via holes are suggested to be punched through the laminates prior to firing for the insertion of contact pins after firing.

DISCLOSURE OF THE INVENTION

It is an object of this invention to provide a method for forming an aperture in a multilayer dielectric structure in such a way that it can mechanically engage a contact pin.

It is another object of this invention to provide a method for forming an aperture in an insulating structure that can swage and hold securely a contact pin while making electrical contact with a conductor line embedded in the structure thus forming a continuous electrical line extending between two major and opposite surfaces of the structure.

It is yet another object of this invention to provide a method for forming an insulating structure having two major and opposite surfaces and conductor lines within the structure terminating in the two major surfaces and forming apertures in at least one major surface in which contact pins are securely anchored while making electrical contact with the adjacent conductor lines.

In accordance with the teachings of this invention, a method is provided for forming an aperture in an insulating material which includes providing a material that shrinks in response to a heat treatment by an amount that is different in one orthogonal direction, from that in another direction and which will under a heat treatment irreversibly change dimensions in these directions in proportion to the differences in their respective coefficients of shrinkage. An aperture is then formed normal to the plane of the orthogonal directions, and a heat treatment is performed to thereby change the shape of the aperture. The insulating material used can be a unitized dielectric body formed from a plurality of dielectric planar layers having two major surfaces orthogonal to the directions of the dielectric planar layers. Such a material can be made to have two different shrinkage factors for the two orthogonal directions in the plane of its major surfaces. When an aperture of a certain size is formed orthogonal to one of its major surfaces, then during the heat treatment the aperture will shrink by a different amount in its two directions and will change its shape. For example, if a round hole is machined in the insulating material prior to firing, then after firing the round hole will change to an elliptical form. A contact pin of a size that will permit it to fit into an aperture such as that formed in this material prior to the firing can be pressed and deformed to fit tightly and securely into the aperture that results following the firing of the dielectric body. The size of the pin is preselected so that after firing the pin will have one dimension which will be larger than one dimension of the aperture and another which will be smaller so that during the insertion the pin will be deformed and some of its material forced to extrude into the available space of the aperture. This will assure that the pin will be mechanically secured in the aperture. By providing the dielectric body with embedded conductor lines extending from one major surface of the material to the other and by forming the aperture and by placing its contact pins right on conductor lines assuring electrical contacts between portions of the conductor lines and the contact pins, electrical connections are established between its conductor termination on one major surface of the dielectric body and the contact pins on the opposite major surface. A similar result can be achieved by forming the aperture and the contact pins adjacent but not in direct contact with the conductor lines and then electrically connecting the pins and conductor lines with metal pads that surround the contact pins and cover the adjoining conductor line terminations. To further improve the reliability of the electrical connection, the pads can be plated with conventional techniques using conductive metallurgical materials, such as solder or braze.

The foregoing and other objects, features, and advantages of the invention will be apparent from the following and more particular description of the preferred embodiments of the invention, as illustrated in the accompanying drawings.

DETAILED DESCRIPTION OF THE DRAWINGS

Figure 1:
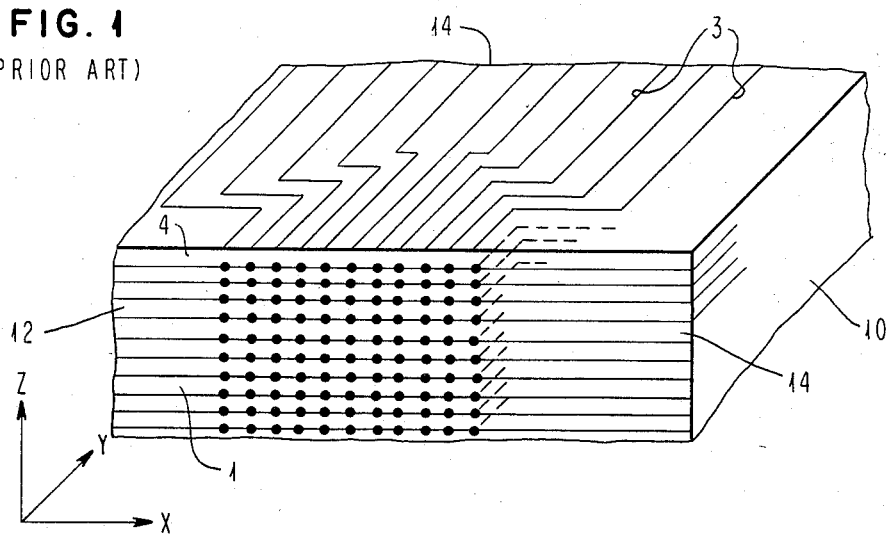
FIG. 1 illustrates a prior art multilayer dielectric structure.

Referring now to FIG. 1, there is shown a multi-level dielectric structure constructed in accordance with the teachings of U.S. Pat. No. 4,193,082. It is shown herein because the present invention can be practiced on a dielectric material such as that described in U.S. Pat. No. 4,193,082 and illustrated herein as FIG. 1. The structure is made of a plurality of dielectric layers which are in turn made by the mixing of finely divided particles of glass, glass-ceramic or ceramic and other chemical additives such as organic solvents and binders which are then cast into slips, which upon evaporation of the solvent, form pliant green sheets. Until these sheets and the particulates within them are sintered together by a heat treatment (referred to as firing), they are termed green sheets.

Details concerning the specific composition and the firing (or sintering) temperatures of green sheets upon which the invention can be practiced can be found in U.S. Pat. Nos. 3,518,756 and 3,988,405, as well as the article "A Fabrication Technique for Multi-Layer Ceramic Modules" by H. D. Kaiser et al, *Solid State Technology* May 1972, pp. 35–40 and the article, "The Third Dimension in Thick-Films Multilayer Technology" by W. L. Clough, *Microelectronics Journal,*, Vol. 3, No. 9 (1970), pp. 23–30. For the fabrication of multilayer green sheet structures, with a conductor pattern 3, the green sheets are coated with a conductive metal using the additive or substractive processes discussed in U.S. Pat. Nos. 4,193,082 and 4,202,007, the disclosures of which are incorporated herein by reference. The green sheets are stacked or superimposed one on the other to form a multilayer dielectric structure having a plurality of dielectric sheets on an XY plane with the conductor lines and their terminations positioned to form the desired pattern. Thus the structure 10, shown in FIG. 1, consists of a plurality of dielectric layers 1, layed on an XY plane and stacked in an orthogonal Z direction. This structure has major surfaces 12 and 14 in the XZ plane and conductor lines 3 extending between surfaces 12 and 14 and having appropriate terminations 4 in both surfaces.

Figure 2A:
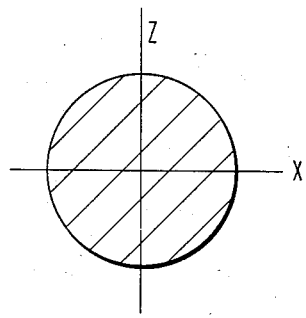
FIG. 2a and FIG. 2b illustrates an aperture formed in accordance with the teachings of this invention before and after the heat treatment.
Figure 2B:
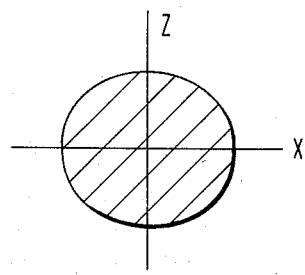

Referring now to FIG. 2a and 2b, there are shown two cross-sectional views of an aperture formed in accordance with the teaching of this invention to a structure such as that shown in FIG. 1 through its surface 14. In FIG. 2a there is shown a circular aperture formed in green sheets before they are placed in a sintering oven and exposed to a heat treatment, which is often referred to as firing. During this heat treatment the binder in the green sheets is driven off, normally by decomposition, followed by sintering or unification of the dielectric particles into a unitized structure. It has been discovered that during this firing, the green sheets shrink by a shrinkage factor that can be predetermined. This srinkage is the result of the elimination of excess binder and the unification of the dielectric particles during firing, and is well known in the art. The "shrinkage factor" is the percentage decrease in a given dimension (e.g. width, length or thickness) of the green sheet, which occurs as the result of firing.

The shrinkage factor of a given green sheet can be varied in a function of sintering conditions and green sheet composition. See e.g. U.S. Pat. No. 3,880,971 (granted 4/29/75 to Pantanelli). Typically, when the green sheets as described above are fired at their conventional sintering temperatures, they shrink in both the X and Y direction by the same factor. However, it has been found that in the Z direction, the green sheets as described above shrink by a greater factor. For example, when 0.0080 inch thick green sheets made up of a high percentage of alumina (e.g. 89% $Al_2O_3$ and 11% glass frit as in the above-cited Kaiser article) are fired at sintering temperatures of approximately 1400° C. or above, the shrinkage factor in the X and Y directions is approximately 16–17% and in the Z direction the shrinkage factor is is about 20%. Thus, if an aperture such as that of FIG. 2a is formed through surface 14 of FIG. 1 in the Y direction of the pressed but unsintered substrate 10, then the aperture will be circular in the XZ plane. After the heat treatment, the sheet will shrink by about 16% in the X direction and by about 20% in the Z direction. Thus the circle of FIG. 2a will be transformed into an ellipse as shown in FIG. 2b, with the two axes having a ratio of 4 to 5. The thicker the green sheets, the greater the shrinkage in the Z direction. Hence, the larger the differential will be for the shrinkage, and the larger the ratio between the two axes of the ellipse. Moreover, it should be noted that the above results were achieved using relatively fresh (e.g. one week to several months old) green sheet material; for older material (e.g. 2–3 years old), these differential shrinkage rates were not obtained.

Figure 3A:
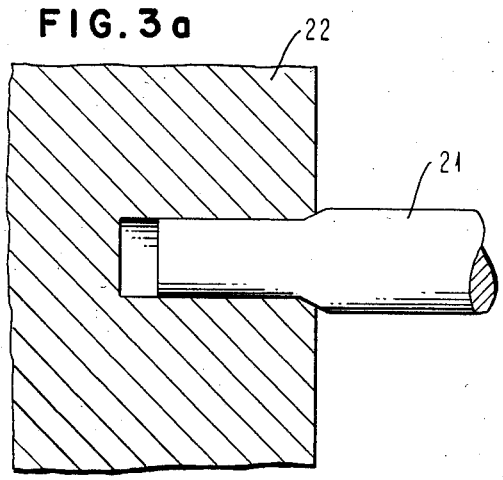
FIG. 3a through 3b illustrates an aperture with a contact pin inserted in it in accordance with the teachings of this invention.
Figure 3B:
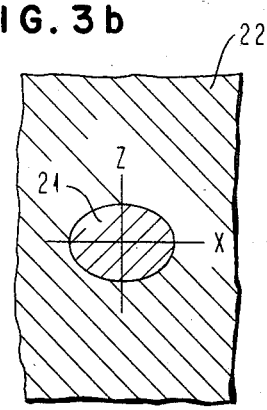

Referring now to FIGS. 3a and 3b, there is shown a contact pin 21 partially deformed and anchored within a multilayer dielectric 22. The pin which was selected to be deformable was inserted in an aperture such as that of FIG. 2a formed in a body in accordance with the teachings of the present invention after the firing. A deformable pin can be made to deform and fit the elliptical aperture as shown in FIG. 3b. Such a pin should be constructed of a material which is malleable enough to not cause cracking in the sintered green sheets upon insertion into the elliptical holes. At the same time, the material should be rigid enough to retain its shape after insertion. Copper wires could be used here. FIG. 3b shows a cross section of pin 21 locked into the dielectric body 22 along the XZ plane.

Figure 4A:
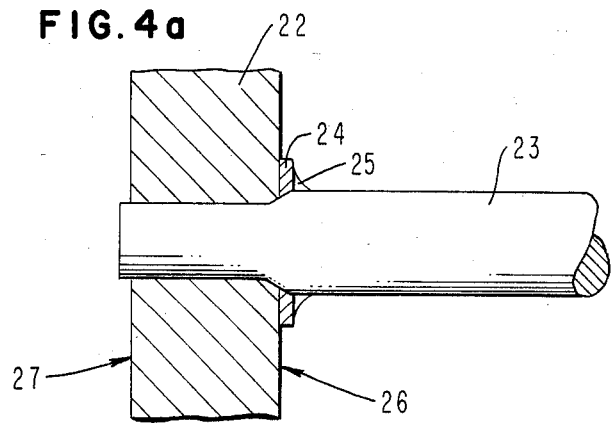
FIGS. 4a through 4c provide diagrammatic views of three embodiments made in accordance with the teachings of this invention.
Figure 4B:
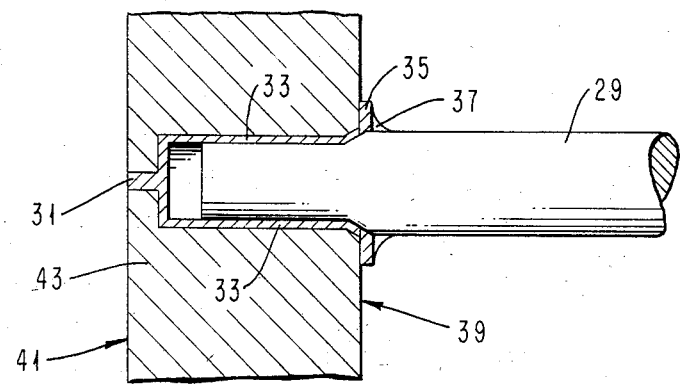

In FIG. 4a there is shown an embodiment of this invention wherein a contact pin 23 is inserted through the entire depth of the dielectric body 22 (which is similar to body 10 of FIG. 1) making contact with both its major surfaces 26 and 27. There are also a pad 24 and a solder or braze fillet 25 to improve the electrical contact of pin 23 with conductive elements on surface 26. Pad 24 may be formed prior to firing and at the same time the conductor lines are formed. It can be formed from a similar material with the conductor lines, such as, for example from tungsten or molydenum or copper. After firing the pads they may be coated with layers of Ni and Au to produce a solder wettable surface. The solder or braze fillet 25 is formed with conventional soldering or brazing techniques to assure a good electrical contact between the pin and the pad. In FIG. 4b there is shown another embodiment of this invention wherein a contact pin 29 does not go through the dielectric body 43 (which is similar to body 10 of FIG. 1) but it goes only part way. However pin 29 is anchored in an aperture that was formed on a conductor line that is flared close to surface 43 so that contact pin 29 can be in contact with portions 33 of the conductor line. A metal pad 35, which is formed with similar techniques as described for pad 24 of FIG. 4a, is also provided around pin 29 on surface 39. Solder or braze fillet material 37 is provided to improve the electrical contact between pin 29 and the metal pad 35 and conductor line portions 33. The remaining portion 31 of the conductor line completes the electrical connection between major surfaces 39 and 41. Portions 33 may be formed or reinforced through the use of a screened metal paste similar to the one used to make the other conductor lines and then joined by the metallurgical pad 35.

Figure 4C:
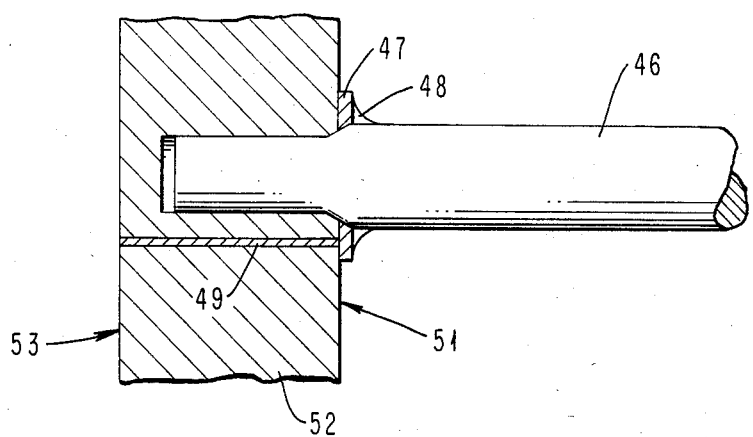

In FIG. 4c there is shown an alternative embodiment constructed in accordance with the teachings of this invention. Contact pin 46 does not go through the material and it does not contact directly conductor line 49. Conductor line 49 is however adjacent pin 46 and is electrically connected to pin 46 through metal pad 47 and solder filet 48. Thus contact pin 46 is the electrical contact for conductor line 49 that extends between major surfaces 51 and 53.

Figure 5:
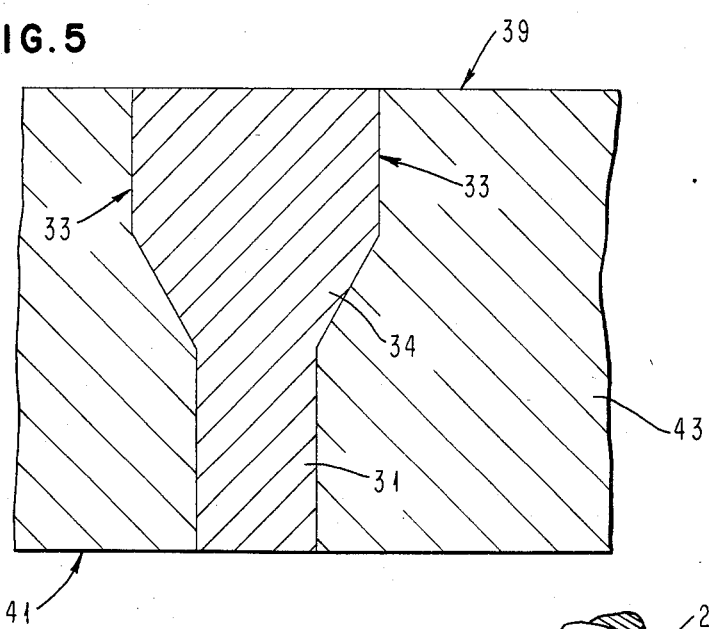
FIG. 5 illustrates a conductive line adopted for use in an embodiment made in accordance with the teachings of this invention and shown in FIG. 6.
Figure 6:
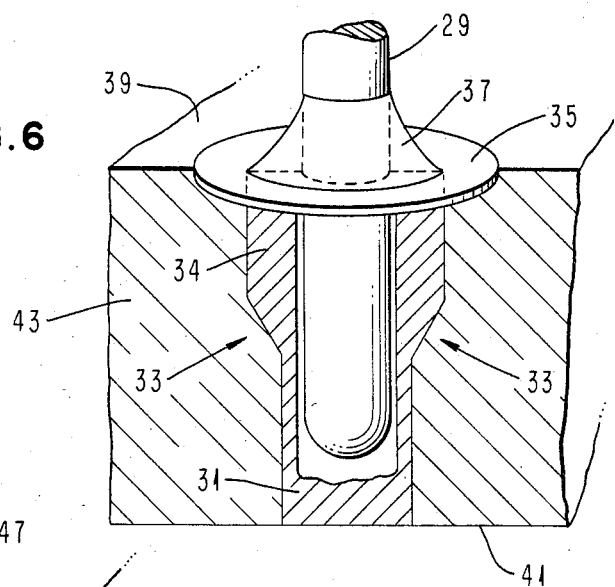
FIG. 6 provides a more detailed view of the embodiment made in accordance with the teachings of this invention.

In FIG. 5 there is shown a conductor line 34 that has a narrow portion 31 and a flared portion 33. It extends between major surfaces 39 and 41 in the dielectric body 43, as shown in more detail in FIG. 6. Conductor line 34 can be formed by conventional conductor pattern forming techniques referred to in above noted U.S. Pat. No. 4,193,082. In FIG. 6 there is shown a more detailed view of an embodiment of this invention. As shown herein contact pin 29 is inserted in accordance with the teachings of the present invention in an aperture in dielectric body 43. The aperture is formed in a portion of body 43 that causes flared conductor 34, which has the form shown in FIG. 5, to split and terminate at surface 39 as two tabs 33, one on either side of the aperture. A metallurgical pad 35 intercepts tabs 33 at two places at which they are electrically connected. A plating of Ni/Au on all exposed conductor pads and tabs provides a wettable surface for the solder fillet to the contact pin 29.

Figure 7:
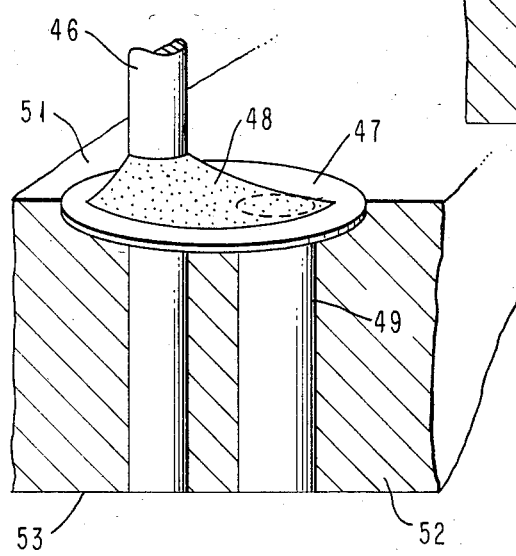
FIG. 7 provides a more detailed view of the embodiment diagrammatically shown in FIG. 4d.

In FIG. 7 there is shown a more detailed view of the embodiment shown in FIG. 4c. Pin 46 is not in direct contact with conductor line 49 but they are electrically connected together through pad 47 and solder fillet or braze 48. Thus together elements 46, 48, 47 and 49 form an electrically conducting path between major surfaces 51 and 53 of dielectric body 52.

While the invention has been described in connection with preferred embodiments, it will be understood that it is not intended to limit the invention to those embodiments described herein and shown in the drawings. On the contrary, it is intended to cover all alternatives, modifications and equivalents, as may be included within the spirit and scope of the invention as defined by the appended claims.

What is claimed is:

1. A method of forming an aperture in a piece of material comprising the steps of:
   providing a material that shrinks in response to a heat treatment by an amount that is different in one orthogonal direction from that in another direction, and which will under said heat treatment irreversibly change dimensions in said orthogonal directions in proportion to said difference;
   forming an aperture which is normal to the plane of said orthogonal directions of said material; and
   performing said heat treatment to thereby change the shape of said aperture.

2. A method as set forth in claim 1 wherein said material is a unitized dielectric body formed of a plurality of dielectric planar layers having two major surfaces orthogonal to the direction of said dielectric planar layers.

3. A method as set forth in claim 2 wherein each of said dielectric layers are made of ceramic particles which are mixed with binder and solvent materials and converted through the evaporation of said solvent into a flexible dielectric layer and having two major surfaces along two orthogonal XY directions whereby when heated at a predetermined temperature said layers shrink and harden.

4. A method as set forth in claim 2 wherein each of said dielectric layers are made of ceramic and glass particles which are mixed with binder and solvent materials and converted through evaporation of said solvent into a flexible dielectric layer and having two major surfaces along two orthogonal XY directions whereby when heated at a predetermined temperature said layers shrink and harden.

5. A method as set forth in claim 1 which further includes the step of forcing a pin in said aperture, after said heat treatment, wherein said pin has a size which is preselected so that when forced into said aperture it is deformed and anchored in said aperture.

6. A method of forming an aperture and securing a conductive pin in said aperture comprising:
   forming a unitized dielectric body from a plurality of dielectric planar layers, said body having two major opposite surfaces orthogonal to the direction of said dielectric planar layers, said body shrinking in response to a heat treatment by an amount that is different along the direction of said dielectric planar layers from that in the orthogonal direction to said planar layers, such that each of said major surfaces shrink by differing amounts along two orthogonal axes;
   forming an aperture in said substrate through at least one of said major surfaces;
   performing said heat treatment to thereby change irreversibly the shape of said aperture through said different amounts of shrinkage along said two orthogonal axes; and
   inserting a deformable contact pin into said aperture with one end tightly locked in said aperture and the opposite end protruding therefrom.

7. A method as set forth in claim 6 wherein:
   said aperture is formed on a predetermined portion of one of said conductor lines thereby making said contact pin one of said exposed terminations of said conductor line.

8. A method as set forth in claim 7 which further includes providing a metal pad on said exposed termination and around said contact pin.

9. A method as set forth in claim 8 wherein said predetermined portion of said conductor line where said aperture is formed, is provded with a flared portion of a sufficient size to permit said aperture to be formed with split tabs of said conductor line on different edges of said aperture.

10. A method as set forth in claim 6 wherein said aperture is formed adjacent a termination of a conductor line and which further includes forming a pad around said aperture and forming a solder fillet electrically connecting said pad to said contact pin.

* * * * *